(12) United States Patent
Schaepperle et al.

(10) Patent No.: US 7,202,737 B2
(45) Date of Patent: Apr. 10, 2007

(54) METHOD OF INFLUENCING AN INPUT SIGNAL AND PREDISTORTER

(75) Inventors: Jörg Schaepperle, Stuttgart (DE); Gabriele Schwoerer, Weil der Stadt (DE); Thomas Bohn, Stuttgart (DE)

(73) Assignee: Alcatel, Paris (FR)

( * ) Notice: Subject to any disclaimer, the term of this patent is extended or adjusted under 35 U.S.C. 154(b) by 58 days.

(21) Appl. No.: 10/853,101

(22) Filed: May 26, 2004

(65) Prior Publication Data

US 2004/0239422 A1 Dec. 2, 2004

(30) Foreign Application Priority Data

May 27, 2003 (EP) ................... 03291281

(51) Int. Cl.
*H03F 1/26* (2006.01)
(52) U.S. Cl. .......................... 330/149; 330/2
(58) Field of Classification Search ............... None
See application file for complete search history.

(56) References Cited

U.S. PATENT DOCUMENTS 6,388,513 B1 * 5/2002 Wright et al. ............... 330/149

FOREIGN PATENT DOCUMENTS

| GB | 2 335 321 A | 9/1999 |
|---|---|---|
| WO | WO 01/08295 A1 | 2/2001 |

OTHER PUBLICATIONS

Jae-Hee Han, Adaptive predistorter for power amplifier based on a real-time estimation of envelope transfer characteristics, Electronics Letters, IEE Stevenage, GB, vol. 35, No. 25, Dec. 9, 1999, pp. 2167-2168, XP006013057.
J. K. Cavers et al, "Optimum Table Spacing in Predistorting Amplifier Linearizers", IEEE Transactions on Vehicular Technology, IEEE, NY, US, vol. 48, No. 5, Sep. 1999, pop. 1699-1705, XP000912539.
A. N. Andrea et al, "A digital approach to efficient RF power amplifier linearization", Global Telecommunications Conference, 1997, Globecom '97, IEEE Phoenix, AZ, USA, Nov. 3-8, 1997, NY, NY, US, IEEE Nov. 1997, pp. 77-81, XP0102546257.

* cited by examiner

Primary Examiner—Khanh Van Nguyen
(74) Attorney, Agent, or Firm—Sughrue Mion, PLLC

(57) ABSTRACT

The present invention relates to a method of influencing an input signal (x), in particular an input signal of a power amplifier of a wireless communication system, wherein said input signal (x) has a range of input amplitudes ($r_0, \ldots, r_{M-1}$), wherein a correction signal ($\Gamma(x)$) depending on said input signal (x) is generated, and wherein said input signal (x) is influenced depending on said correction signal ($\Gamma(x)$).

A generation of said correction signal ($\Gamma(x)$) is based on a plurality of base functions ($\phi_1, \phi_2, \ldots, \phi_{N-1}$), and said range of input amplitudes ($r_0, \ldots, r_{M-1}$) is divided into intervals ($r_0,r_1$),($r_1,r_2$), . . . ,($r_{M-2},r_{M-1}$), wherein each of said base functions ($\phi_1, \phi_2, \ldots, \phi_{N-1}$) contributes to said correction signal ($\Gamma(x)$) in a limited number of intervals (($r_0,r_1$), ($r_1,r_2$), . . . ,($r_{M-2},r_{M-1}$)). Thus it is possible to change parts of the correction signal by adapting some of said base functions without influencing the whole correction signal.

16 Claims, 3 Drawing Sheets

METHOD OF INFLUENCING AN INPUT SIGNAL AND PREDISTORTER

TECHNICAL FIELD

The present invention relates to a method of influencing an input signal and a predistorter.

The invention is based on a priority application, EP 03291281.8, which is hereby incorporated by reference.

BACKGROUND OF THE INVENTION

Such methods and corresponding predistorters are per se known from prior art and they are used to shape an input signal before said input signal is fed into a power amplifier. The power amplifier itself usually has a nonlinear characteristic which is undesirable since it causes the input signal to be distorted, i.e. a gain imparted on said input signal by said power amplifier is not constant but depends on an amplitude of said input signal.

To avoid this unwanted distortion, the input signal is predistorted by a predistorter prior to feeding it to said power amplifier. The predistorter distorts or shapes, respectively, the characteristic of the input signal in a manner opposite to the distortion caused by said power amplifier, and in a well-tuned system an overall distortion of said input signal may thus be avoided. Said predistortion is usually achieved by multiplying said input signal by a correction signal or by adding such a correction signal which depends on said input signal.

Contemporary methods use so-called polynomial predistorters wherein the correction signal is based on a polynomial. Since each function value of a polynomial depends on all coefficients of said polynomial, it is not possible to tune the correction signal or certain intervals of it, respectively, via changing one or few coefficients without changing the complete correction signal. As a further disadvantage, said polynomial predistorter only works well for a limited range of input amplitudes and is thus not flexible with respect to a varying mean power of said input signal. Furthermore, the polynomial predistorter is not flexible enough with respect to special required shapes of a characteristic of the nonlinear power amplifier.

Another solution known from prior art employs a lookup table to determine function values of said correction signal. Consequently, it is possible to configure a predistorter wherein each function value depends on one parameter that can be read from said lookup table. This solution also lacks flexibility, because especially in adaptive systems, where a dynamic modification of said parameters is required, the number of parameters that must be updated is too high.

The present invention relates to a method of influencing an input signal, in particular an input signal of a power amplifier of a wireless communication system, wherein said input signal has a range of input amplitudes, wherein a correction signal depending on said input signal is generated, and wherein said input signal is influenced depending on said correction signal.

The present invention also relates to a predistorter for influencing an input signal, in particular an input signal of a power amplifier of a wireless communication system, wherein said input signal has a range of input amplitudes, wherein a correction signal depending on said input signal is generated, and wherein said input signal is influenced depending on said correction signal.

Therefore, it is an object of the present invention to provide an improved method of influencing an input signal and a corresponding predistorter which provide increased flexibility.

SUMMARY OF THE INVENTION

This object is achieved by a method of influencing an input signal, in particular an input signal of a power amplifier of a wireless communication system, wherein said input signal has a range of input amplitudes, wherein a correction signal depending on said input signal is generated, and wherein said input signal is influenced depending on said correction signal, wherein a generation of said correction signal is based on a plurality of base functions, and in that said range of input amplitudes is divided into intervals, wherein each of said base functions contributes to said correction signal in a limited number of intervals.

The object of the invention is further achieved by a predistorter for inlcuencing an input signal, in particular an input signal of a power amplifier of a wireless communication system, wherein said input signal has a range of input amplitudes, wherein a correction signal depending on said input signal is generated, and wherein said input signal is influenced depending on said correction signal, wherein a generation of said correction signal is based on a plurality of base functions, and wherein said range of input amplitudes is divided into intervals, wherein each of said base functions contributes to said correction signal in a limited number of intervals.

According to the present invention, the generation of said correction signal is based on a plurality of base functions, and said range of input amplitudes is divided into intervals, wherein each of said base functions contributes to said correction signal in a limited number of intervals.

Hence it is possible to shape a desired characteristic of said correction signal more accurately as compared to the approach using one polynomial for the definition of the whole correction signal, because changing one base function or its coefficients or the like does not affect the whole correction signal but only some portions of the correction signal which correspond to the intervals in which said changed base function contributes to the correction signal.

The other portions of said correction signal remain unchanged, because of which the mechanism may also be said to have a "local effect" on said correction signal, and which enables an elaborated adaption of said correction signal.

To control the local effect more precisely, a variant of the inventive method is characterized in that a set of base functions contributes to said correction signal only in a corresponding interval and/or in a limited number of neighbour intervals. I.e. changing such a base function will affect the corresponding interval and a limited number of neighbour intervals thus affecting a portion of said correction signal that is larger than one single interval but yet significantly smaller than the whole correction signal. In this case, base functions of neighbour intervals may overlap each other.

Contributing to said correction signal in this sense of the present invention means to significantly change the correction signal, regardless of the mode by which said change is performed. I.e. if various base functions are added together, a contribution in the sense of the present invention means that said base functions have non-zero function values large enough to change the resulting sum in a noticeable way.

Consequently, a base function may also have non-zero function values and may not contribute to said correction signal in the above sense, as long as said non-zero function values are very small compared to any other function value of the above mentioned sum.

According to a further advantageous embodiment of the present invention, said base functions are chosen such that said correction signal and a first and/or higher derivatives of said correction signal are continuous. This enables the correction signal to be modified by changing said base functions or coefficients of said base functions or the like while maintaining a smooth correction signal. Algorithms for changing said base functions must hence not obey any restriction to changing said base functions in order to maintain a smooth correction signal.

A further variant of the invention is characterized in that said base functions have non-zero function values within a number of neighbour intervals and function values and/or derivatives of first or higher order of zero at all but one interval bounds of said neighbour intervals, in that either a function value or a derivative of said base functions is different from zero at one interval bound of said neighbour intervals, and in that said base functions are smooth. This guarantees the above explained local effect while at the same time ensuring a smooth correction signal.

According to a very advantageous variant of the present invention, a maximum of four different base functions has non-zero function values at a distinct input amplitude, i.e. at a distinct interval of said range of input amplitudes. Hence only said four base functions and their parameters contribute to a function value of the correction signal used for predistorting the input signal thus again achieving said "local effect".

Instead of having non-zero function values, said four different base functions may have rather small function values, either, that do not contribute to said correction signal in said interval significantly, or in case said base functions are multiplied with each other, they may as well have function values of about one in order not to contribute to said correction signal significantly.

It is not necessary to restrict the number of base functions to four, every other number of base functions may also be used, as long as the overall number of base functions is e.g. smaller than the number of parameters to be changed with a prior art lookup table.

Another variant of the method according to the present invention is characterized in that said correction signal is a weighted sum of said base functions according to $$\Gamma(x) = \sum_{i=0}^{N-1} a_i \varphi_i(r(x)),$$

wherein complex coefficients $$\alpha_i \epsilon C, i=0, \ldots, N-1$$

are provided for each base function $$\phi_i, i=0, \ldots, N-1,$$

and wherein $$r = r(x), r \epsilon R$$

is a function of said input signal (x).

Since in most cases, especially with digital baseband predistortion for power amplifiers of wireless communication systems, said input signal x is a complex variable, r(x) may e.g. be chosen as an absolute value of said input signal, if the correction signal is desired to only depend on the input signal's amplitude. The base functions $\phi_i, i=0, \ldots, N-1$, in turn, depend on r(x).

The coefficients $\alpha_i \epsilon C, i=0, \ldots, N-1$ are complex numbers and are used as weights which determine to what extent each of the base functions contributes to said correction signal. The coefficients may also attain a value of zero, if a reduced number of base functions is sufficient for shaping the desired correction signal.

According to a further variant of the present invention, at least one of said base functions is a polynomial, in particular a polynomial of third order, which allows an easy evaluation of function values and a simple base function definition.

According to a very advantageous variant of the present invention, the definition of said N base functions is:

$$\varphi_0(r) = \begin{cases} 1 - s^2(3-2s), & r_0 \le r < r_1 \\ 0 & \text{else} \end{cases},$$

$$\varphi_1(r) = \begin{cases} (r_1 - r_0)s(1-s)^2, & r_0 \le r < r_1 \\ 0 & \text{else} \end{cases},$$

$$\varphi_{2i}(r) = \begin{cases} s^2(3-2s), & r_{i-1} \le r < r_i \\ 1 - s^2(3-2s), & r_i \le r < r_{i+1} \\ 0 & \text{else} \end{cases} i = 1, \ldots, M-2,$$

$$\varphi_{2i+1}(r) = \begin{cases} (r_i - r_{i-1})s^2(s-1), & r_{i-1} \le r < r_i \\ (r_{i+1} - r_i)s(1-s)^2, & r_i \le r < r_{i+1} \\ 0 & \text{else} \end{cases} i = 1, \ldots, M-2,$$

$$\varphi_{2M-2}(r) = \begin{cases} s^2(3-2s), & r_{M-2} \le r < r_{M-1} \\ 0 & \text{else} \end{cases},$$

$$\varphi_{2M-1}(r) = \begin{cases} (r_{M-1} - r_{M-2})s^2(s-1), & r_{M-2} \le r < r_{M-1} \\ 0 & \text{else} \end{cases}, \text{wherein}$$

$$S = \begin{cases} \dfrac{r - r_{i-1}}{r_i - r_{i-1}}, & r_{i-1} \le r < r_i \\ \dfrac{r - r_i}{r_{i+1} - r_i}, & r_i \le r < r_{i+1} \end{cases}$$

defines an offset from a lower limit of an interval ranging from a first input signal amplitude $r_i$ to a second input signal amplitude $r_{i+1}$, and wherein $$M = \frac{N}{2}.$$

As can be seen from the above definition, the range $(r_0, \ldots, r_{M-1})$ of input amplitudes is subdivided into M−1 intervals $(r_0, r_1), (r_1, r_2), \ldots, (r_{M-2}, r_{M-1})$, wherein for each interval corresponding base functions are defined. Each of said base functions has only a local effect on said correction signal in that for each interval $(r_i, r_{i+1})$ not more than four base functions have non-zero function values.

The weighted sum representing the correction signal can hence be simplified to $$\Gamma(x) = \alpha_{2i}\phi_{2i}(r(x)) + \alpha_{2i+1}\phi_{2i+1}(r(x)) + \alpha_{2i+2}\phi_{2i+2}(r(x)) + \alpha_{2i+3}\phi_{2i+3}(r(x))$$

for $r_i \le r \le r_{i+1}$

A further embodiment of the inventive method proposes to use the auxiliary functions $$\Psi_0(s)=1-s^2(3-2s)$$

$$\Psi_1(s)=s(1-s)^2$$

$$\Psi_2(s)=s^2(3-2s)$$

$$\Psi_3(s)=s^2(s-1)$$

to calculate said base functions.

At least one of said auxiliary functions $\Psi_0(s),\Psi_1(s),\Psi_2(s),\Psi_3(s)$ is stored to/read from a lookup table in a further advantageous embodiment of the present invention.

According to yet a further variant of the invention, an interval width $r_{i+1}-r_i$ is independent of i which leads to a constant interval width $r_{i+1}-r_i$ for i=0, . . . ,M−1, which enables a simplified evaluation of said base functions and said correction signal.

A reciprocal value $$q_i = \frac{1}{r_{i+1}-r_i}$$

of an interval width $r_{i+1}-r_i$ is stored to/read from a lookup table in a further variant of the invention which eliminates the need of repeatedly performing the corresponding division operations.

A further advantageous embodiment of the method according to the present invention is characterized in that said input signal is delayed before being influenced by said correction signal, which may be necessary in most cases and depends on the computation time required for obtaining said correction signal from said input signal.

A further solution to the object of the present invention is given by a predistorter according to the invention.

BRIEF DESCRIPTION OF THE DRAWINGS

Further advantages and details are presented in the following detailed description with reference to the drawings.

DETAILED DESCRIPTION OF THE DRAWINGS

Figure 1:
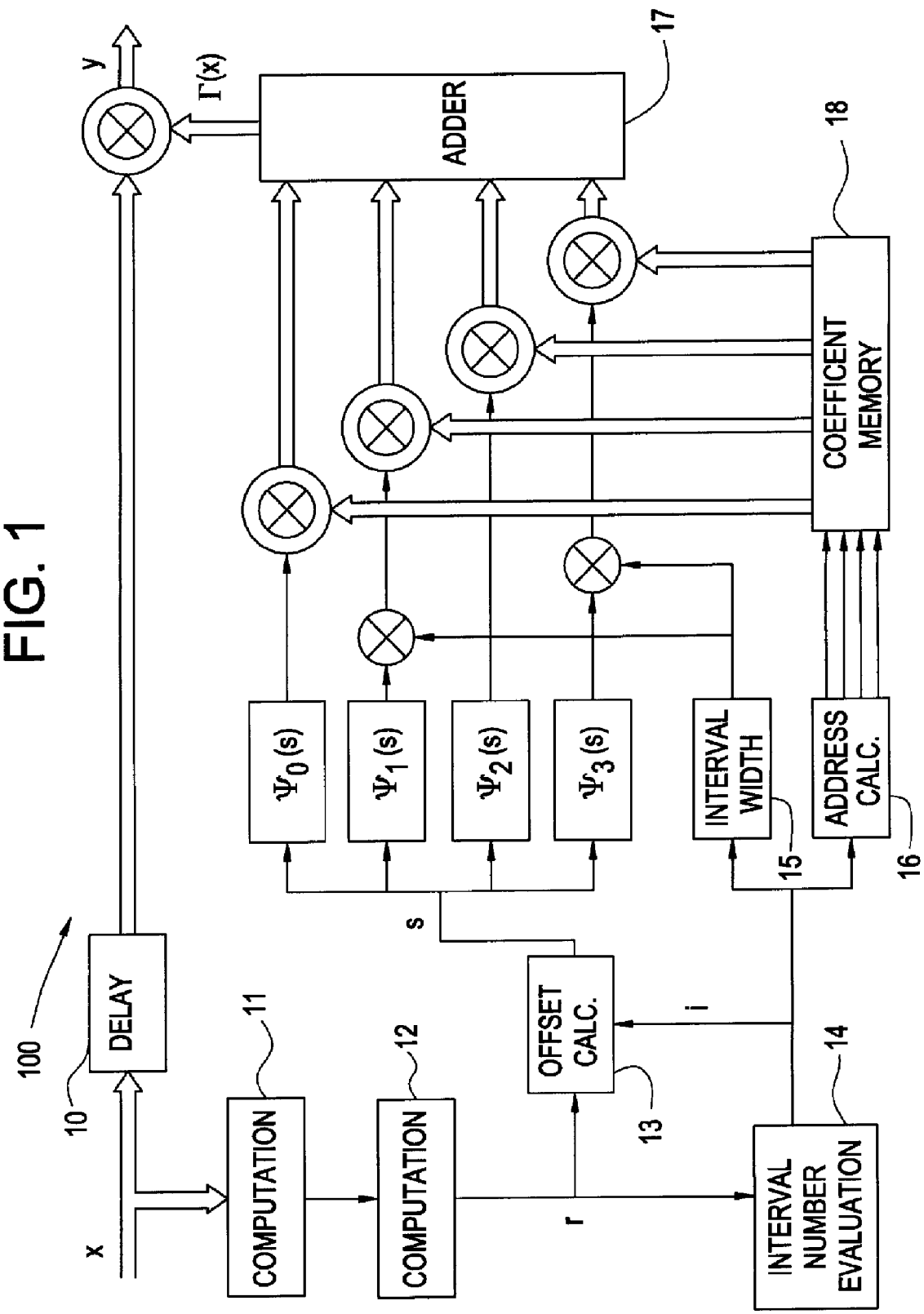
FIG. 1 shows a block diagram of an inventive predistorter.

As can be seen from the block diagram of FIG. 1, a predistorter 100 receives a complex input signal x which, after a certain delay realised by delay means 10, is multiplied by a complex correction signal $\Gamma(x)$ that depends on said input signal x. Said delay caused by the delay means 10 accounts for a computation time required by the predistorter 100 to calculate the correction signal $\Gamma(x)$ out of the input signal x.

The calculation of the correction signal $\Gamma(x)$ is described in the following passages.

At first, an absolute value r of said input signal x is obtained by successively calculating the squared absolute value within calculation means 11 and applying a square root function to said squared absolute value within calculation means 12:

$$r(x)=\sqrt{x_I^2+x_Q^2}, \text{ wherein}$$

$$X=x_I+jx_Q \text{ and } x_I,x_Q \in R.$$

In a digital baseband system of a wireless communications system, r(x) corresponds to an amplitude of said input signal x.

The square root calculation operation performed within calculation means 12 may be approximated by a polynomial. This is particularly useful if the predistorter 100 is realized on e.g. a digital signal processor (DSP).

After obtaining said absolute value r(x), which in the following explanations will be referred to as amplitude r of said input signal, a corresponding interval number is evaluated by interval number evaluation means 14.

This is necessary to determine the correct set of base functions to be used to calculate the portion of the correction signal $\Gamma(x)$ which is associated to the respective amplitude r.

Figure 2:
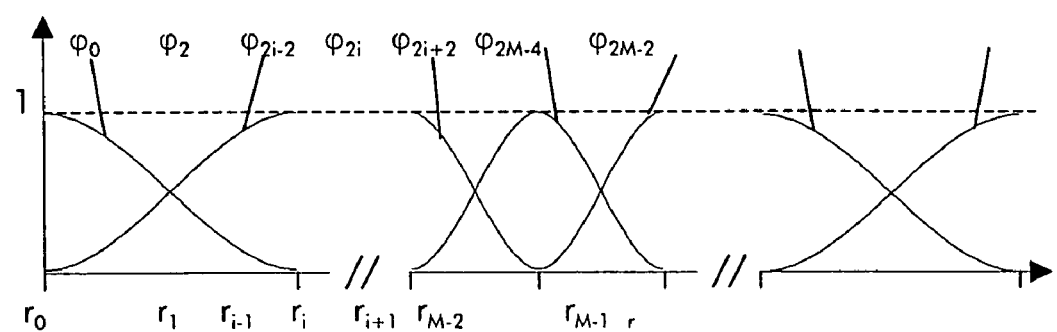
FIG. 2 shows base functions according to the present invention.
Figure 2:
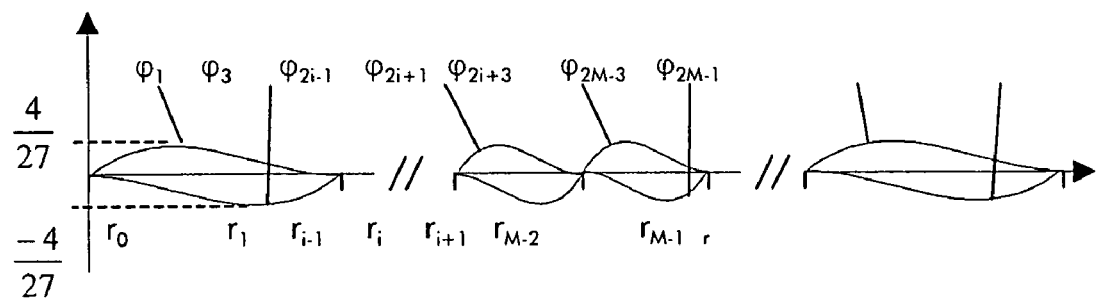
Figure 3:
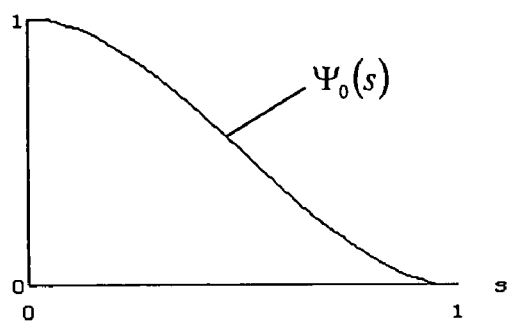
FIG. 3 shows auxiliary functions used to obtain said base functions of FIG. 2.
Figure 3:
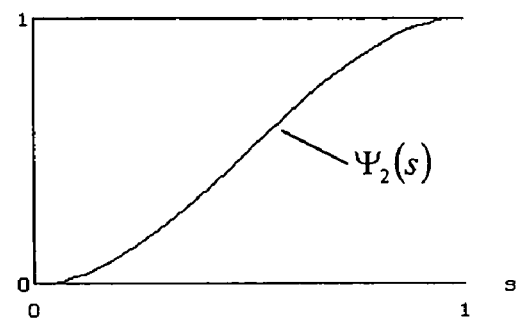
Figure 3:
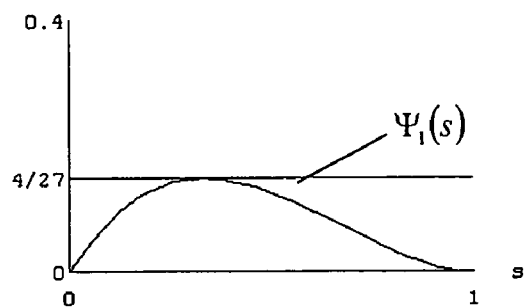
Figure 3:
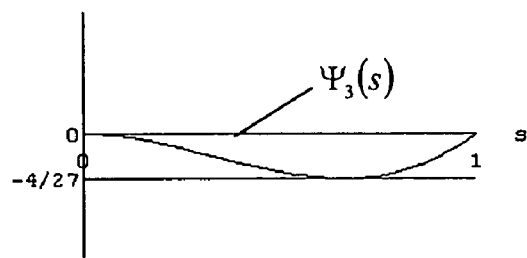

As can be seen from FIG. 2, the range $(r_0, \ldots, r_{M-1})$ of input amplitudes is subdivided into intervals $(r_0,r_1)$, $(r_1,r_2), \ldots, (r_{M-2},r_{M-1})$, wherein for each interval corresponding base functions $$\varphi_0(r) = \begin{cases} 1-s^2(3-2s), & r_0 \le r < r_1 \\ 0 & \text{else} \end{cases},$$

$$\varphi_1(r) = \begin{cases} (r_1-r_0)s(1-s)^2, & r_0 \le r < r_1 \\ 0 & \text{else} \end{cases},$$

$$\varphi_{2i}(r) = \begin{cases} s^2(3-2s), & r_{i-1} \le r < r_i \\ 1-s^2(3-2s), & r_i \le r < r_{i+1} \\ 0 & \text{else} \end{cases} i=1,\ldots,M-2,$$

$$\varphi_{2i+1}(r) = \begin{cases} (r_i-r_{i-1})s^2(s-1), & r_{i-1} \le r < r_i \\ (r_{i+1}-r_i)s(1-s)^2, & r_i \le r < r_{i+1} \\ 0 & \text{else} \end{cases} i=1,\ldots,M-2,$$

$$\varphi_{2M-2}(r) = \begin{cases} s^2(3-2s), & r_{M-2} \le r < r_{M-1} \\ 0 & \text{else} \end{cases},$$

$$\varphi_{2M-1}(r) = \begin{cases} (r_{M-1}-r_{M-2})s^2(s-1), & r_{M-2} \le r < r_{M-1} \\ 0 & \text{else} \end{cases},$$

are provided, and wherein $$s = \begin{cases} \frac{r-r_{i-1}}{r_i-r_{i-1}}, & r_{i-1} \le r < r_i \\ \frac{r-r_i}{r_{i+1}-r_i}, & r_i \le r < r_{i+1} \end{cases}$$

defines an offset from a lower limit of an interval ranging from a first input signal amplitude $r_i$ to a second input signal amplitude $r_{i+1}$, and wherein $$M = \frac{N}{2},$$

i.e. the overall number N of base functions is 2M.

The base functions of a distinct interval $(r_i,r_{i+1})$ have non-zero function values only within two neighbour inter vals, which results in a simplified expression for the respective portion of the correction signal $$\Gamma(x)=\alpha_{2i}\phi_{2i}(r(x))+\alpha_{2i+1}\phi_{2i+1}(r(x))+\alpha_{2i+2}\phi_{2i+2}(r(x))+\alpha_{2i+3}\phi_{2i+3}(r(x))$$

at that interval $(r_i, r_{i+1})$.

According to the above simplified expression for the correction signal, the correction signal for the interval $(r_i, r_{i+1})$ only depends on four of said N base functions:

$$\phi_{2i}(r(x)),\phi_{2i+1}(r(x)),\phi_{2i+2}(r(x)),\phi_{2i+3}(r(x)),$$

and on the respective coefficients.

Consequently, said portion of the correction signal may individually be shaped according to system requirements concerning an optimal predistortion of said input signal x without influencing other portions of said correction signal. This "local effect" is achieved by limiting the number of base functions that contribute to said correction signal $\Gamma(x)$ and by providing extra sets of base functions $\phi_{2i}(r(x))$, $\phi_{2i+1}(r(x)),\phi_{2i+2}(r(x)),\phi_{2i+3}(r(x))$ for individual intervals.

The base functions $\phi_i(r)$ and their first derivatives are continuous, and the coefficients of the polynomials the base functions $\phi_i(r)$ are composed of are defined by function values of and derivatives of the respective base function at three subsequent input signal amplitudes. The base functions can be divided into two different classes, the even-numbered base functions $\phi_{2i}(r)$ and the odd-numbered base functions $\phi_{2i+1}(r)$.

The series of weighted base functions yielding said correction signal $$\Gamma(x)=\alpha_{2i}\phi_{2i}(r(x))+\alpha_{2i+1}\phi_{2i+1}(r(x))+\alpha_{2i+2}\phi_{2i+2}(r(x))+\alpha_{2i+3}\phi_{2i+3}(r(x))$$

itself is continuous, as well as its first derivative with respect to r. Furthermore, the series is a linear function of the coefficients $\alpha_i$.

The values of even-numbered coefficients $\alpha_{2i},\alpha_{2i+2},\ldots$ define function values of said correction signal $\Gamma(x)$ at said input amplitudes $r_i$, and the values of odd-numbered coefficients $\alpha_{2i+1},\alpha_{2i+3},\ldots$ define derivatives of said correction signal $\Gamma(x)$ at said input amplitudes $r_i$.

Due to the definition of the correction signal $\Gamma(x)$, its smoothness is guaranteed for arbitrary coefficient values, and the correction signal $\Gamma(x)$ is suitable for approximating a required shape/characteristic in the complete range of input amplitudes $r_i$.

After determining the correct set of base functions to be used to calculate the portion of the correction signal $\Gamma(x)$ which is associated to the respective amplitude r, i.e. after finding the index variable i which relates a set of base functions and their coefficients to said input amplitude, said index variable i is fed to an address calculation system 16 which calculates memory addresses of the required complex coefficients of said base functions and outputs said memory addresses to a coefficient memory 18 which provides the selected coefficients to complex multipliers, cf. FIG. 2.

At the same time, said offset $$s = \begin{cases} \frac{r-r_{i-1}}{r_i-r_{i-1}}, & r_{i-1} \leq r < r_i \\ \frac{r-r_i}{r_{i+1}-r_i}, & r_i \leq r < r_{i+1} \end{cases}$$

is evaluated by offset calculation means 13, which enables to calculate the function values of the base functions by means of auxiliary functions $$\Psi_0(s)=1-s^2(3-2s)$$

$$\Psi_1(s)=s(1-s)^2$$

$$\Psi_2(s)=s^2(3-2s)$$

$$\Psi_3(s)=s^2(s-1)$$

which require said offset s as an input variable.

Said auxiliary functions can be pre-calculated and the resulting functions values can be stored to/read from a lookup table.

Due to the following symmetry $$\Psi_2(s)=\Psi_0(1-s)$$

$$\Psi_3(s)=-\Psi_1(1-s)$$

in a further embodiment of the present invention it is sufficient to calculate and/or store the function values of said auxiliary functions only for a first, lower half $$\left(r_i, \frac{r_i + r_{i+1}}{2}\right)$$

of an interval $(r_i, r_{i+1})$ and to use a modified offset $$s' = 1 - s = \frac{r_{i+1} - r}{r_{i+1} - r_i}$$

for attaining auxiliary function values of the second, upper half $$\left(\frac{r_i + r_{i+1}}{2}, r_{i+1}\right)$$

of the interval $(r_i, r_{i+1})$.

To make use of said symmetry, the sign of the function values of said auxiliary functions as well as the calculation of the coefficient addresses within said calculation system 16 must be change appropriately. By using said symmetry, memory requirements can be decreased by a factor of two as far as a storage of said function values is concerned.

Based on said index variable i, block 15 calculates an interval width $r_{i+1}-r_i$ which is required for obtaining said base functions $$\varphi_{2i}(r) = \Psi_0\left(\frac{r-r_i}{r_{i+1}-r_i}\right)$$

$$\varphi_{2i+1}(r) = (r_{i+1}-r_i)\Psi_1\left(\frac{r-r_i}{r_{i+1}-r_i}\right)$$

$$\varphi_{2i+2}(r) = \Psi_2\left(\frac{r-r_i}{r_{i+1}-r_i}\right)$$

$$\varphi_{2i+3}(r) = (r_{i+1}-r_i)\Psi_3\left(\frac{r-r_i}{r_{i+1}-r_i}\right)$$

out of said auxiliary functions $\Psi_0,\Psi_1,\Psi_2,\Psi_3$.

The interval width $r_{i+1}-r_i$, or its reciprocal value, can also be stored to a lookup table.

The auxiliary functions $\Psi_1, \Psi_3$ need not be multiplied with said interval width $r_{i+1}-r_i$, if said interval width $r_{i+1}-r_i$ is constant for each value of said index variable i. The corresponding multipliers of the predistorter 100 of FIG. 1 may be omitted in this case, as well as block 15.

Finally, the evaluated auxiliary function values are added in an adder 17, which yields said correction signal $\Gamma(x)$ that is multiplied with the delayed input signal x.

The presented method and predistorter advantageously provide a correction signal $\Gamma(x)$ and an output signal y which is a linear function of a real part of the coefficients $\alpha_i$, of an imaginary part of the coefficients $\alpha_i$ and of the coefficients $\alpha_i$ themselves, too, which is very useful for some adaptation algorithms.

Furthermore, in comparison to a lookup-table approach of prior art, the number of coefficients for the base functions is very small which enables the method to be used in systems with limited feedback information, where only a small number of coefficients can be adapted to optimally shape the characteristic of the correction signal.

Since smoothness of the correction signal is guaranteed by the presented solution, adaptive algorithms can alter coefficients without obeying restrictions for assuring a continuous correction signal. The predistorter can also be easily implemented.

If at a certain point only feedback information for adapting coefficients corresponding to small signal amplitudes are available, an existing approximation of the correction signal via the base functions for large signal amplitudes is not influenced and remains constant until feedback information for improving coefficients corresponding to large signal amplitudes will be available again. The predistorter according to the present invention is therefore not as sensitive to power variations of the input signal as prior art polynomial predistorters.

Furthermore, with the various sets of base functions, any desired characteristic of the correction signal can be implemented more easily as compared to a prior art lookup table approach. The proposed method does also enable a faster adaptation as is given with contemporary lookup table solutions.

The method according to the present invention and/or the predistorter are not limited to be used with a power amplifier, they may be used with any non-linear device or channel which requires a process of predistortion.

The invention claimed is:

1. A method of influencing an input signal of a power amplifier of a wireless communication system, wherein said input signal has a range of input amplitudes, said method comprising the steps of: generating a correction signal from said input signal in accordance with a correction signal function, and modifying said input signal in accordance with said correction signal, wherein said generating step comprises:
    dividing said range of input amplitudes into a plurality of amplitude intervals, and
    using a different correction signal function in each of at least two different ones of said intervals.

2. A method according to claim 1, wherein said correction signal function is a combination of a plurality of different base functions and said step of using a different correction signal function comprises using different combinations of said base functions.

3. A method according to claim 2, wherein a set of said base functions contributes to said correction signal function only in a corresponding interval and/or in a limited number of neighboring intervals.

4. A method according to claim 2, wherein said base functions are chosen such that said correction signal and a first and/or higher derivatives of said correction signal are continuous.

5. A method according to claim 2, wherein said base functions have non-zero function values within a number of neighboring intervals and have function values and/or derivatives of first or higher order of zero at all but one interval boundary of said neighboring intervals, wherein either a function value or a derivative of said base function is non-zero at one interval boundary of said neighboring intervals, and wherein said base functions are smooth.

6. A method according to claim 2, wherein said correction signal $\Gamma(x)$, where x is said input signal is a weighted sum of said base functions according to $$\Gamma(x) = \sum_{i=0}^{N-1} a_i \varphi_i(r(x)),$$

wherein complex coefficients $$a_i \in C, i=0, \ldots, N-1$$

are provided for each base function $$\phi_i, i=0, \ldots, N-1,$$

and wherein $$r=r(x), r \in R$$

is a function of said input signal.

7. A method according to claim 2, wherein at least one of said base functions is a polynomial, in particular a polynomial of third order.

8. A method according to claim 2, wherein a maximum of four different base functions have non-zero function values at a distinct input amplitude.

9. A method according to claim 2, wherein said base functions comprise a set of N base functions $\phi(r)$ defined as:

$$\varphi_0(r) = \begin{cases} 1-s^2(3-2s), & r_0 \leq r < r_1 \\ 0 & \text{else} \end{cases},$$

$$\varphi_1(r) = \begin{cases} (r_1-r_0)s(1-s)^2, & r_0 \leq r < r_1 \\ 0 & \text{else} \end{cases},$$

$$\varphi_{2i}(r) = \begin{cases} s^2(3-2s), & r_{i-1} \leq r < r_i \\ 1-s^2(3-2s), & r_i \leq r < r_{i+1} \\ 0 & \text{else} \end{cases} i=1,\ldots,M-2,$$

$$\varphi_{2i+1}(r) = \begin{cases} (r_i-r_{i-1})s^2(s-1), & r_{i-1} \leq r < r_i \\ (r_{i+1}-r_i)s(1-s)^2, & r_i \leq r < r_{i+1} \\ 0 & \text{else} \end{cases} i=1,\ldots,M-2,$$

$$\varphi_{2M-2}(r) = \begin{cases} s^2(3-2s), & r_{M-2} \leq r < r_{M-1} \\ 0 & \text{else} \end{cases},$$

$$\varphi_{2M-1}(r) = \begin{cases} (r_{M-1}-r_{M-2})s^2(s-1), & r_{M-2} \leq r < r_{M-1} \\ 0 & \text{else} \end{cases}, \text{wherein}$$

-continued $$s = \begin{cases} \dfrac{r - r_{i-1}}{r_i - r_{i-1}}, & r_{i-1} \le r < r_i \\ \dfrac{r - r_i}{r_{i+1} - r_i}, & r_i \le r < r_{i+1} \end{cases}$$

defines an offset from a lower limit of an interval ranging from a first input signal amplitude $r_i$ to a second input signal amplitude $r_{i-1}$, and wherein $r=r(x)$, $r \in R$ is a function of said input signal and wherein M and N are integers and $$M = \frac{N}{2}.$$

10. A method according to claim 9, wherein an interval width $r_{i+1} - r_i$ independent of i.

11. A method according to claim 8, wherein a reciprocal value $$q_i = \frac{1}{r_{i+1} - r_i}$$

of an interval width $r_{i+1} - r_i$, where r is a function of said input signal, is stored to read from a lookup table.

12. A method according to claim 9, wherein auxiliary functions $\Psi_0(s) = 1 - s^2(3 - 2s)$ $\Psi_1(s) = s(1 - s^2)$ $\Psi_2(s) = s^2(3 - 2s)$ $\Psi_3(s) = s^2(s - 1)$ are used to calculate said base functions.

13. A method according to claim 9, wherein at least one of said auxiliary functions is stored to/read from a lookup table.

14. A method according to claim 2, wherein said input signal is delayed before being modified by said correction signal.

15. A predistorter for modifying an input signal of a power amplifier of a wireless communication system, wherein said input signal has a range of input amplitudes, said predistorter including:
- a correction signal generator which generates a correction signal from said input signal in accordance with a correction signal function, and
- a corrected signal generator which modifies said input signal in accordance with said correction signal,
- wherein said correction signal function is based on a combination of a plurality of base functions, and wherein different combinations of said base functions are used in different amplitude intervals of said range of input amplitudes.

16. A predistorter for modifying an input signal of a power amplifier of a wireless communication system, wherein said input signal has a range of input amplitudes, said predistorter including:
- a correction signal generator which generates a correction signal from said input signal in accordance with a correction signal function, and
- a corrected signal generator which modifies said input signal in accordance with said correction signal,
- wherein said correction signal function is based on a combination of a plurality of base functions, and wherein different combinations of said base functions are used in different amplitude intervals of said range of input amplitudes, with each said combination of said base functions contributing to said correction signal function only in a corresponding one of said intervals and/or in a limited number of neighboring intervals.

* * * * *